United States Patent [19]

Pfeiffer

[11] Patent Number: 5,932,324
[45] Date of Patent: Aug. 3, 1999

[54] MATERIAL FOR PRODUCING ELECTRICALLY CONDUCTING CONNECTIONS IN THERMOPLASTIC MOLDINGS

[75] Inventor: Bernhard Pfeiffer, Kelkheim, Germany

[73] Assignee: Hoechst Aktiengesellschaft, Frankfurt, Germany

[21] Appl. No.: 08/511,260

[22] Filed: Aug. 4, 1995

[30] Foreign Application Priority Data

Aug. 8, 1994 [DE] Germany ............... 44 27 983

[51] Int. Cl.$^6$ ............... B32B 3/00; B32B 7/00; B32B 15/00
[52] U.S. Cl. ............... 428/209; 428/901; 252/512; 252/513; 252/518; 252/519; 252/520; 361/748; 361/749
[58] Field of Search ............... 523/215, 217; 361/748, 749; 428/209, 901; 252/512, 513, 518, 519, 520

[56] References Cited

U.S. PATENT DOCUMENTS 4,229,328 10/1980 Makiro ............... 523/215

FOREIGN PATENT DOCUMENTS

| 0256428 | 2/1988 | European Pat. Off. . |
| 0323685 | 7/1989 | European Pat. Off. . |
| 0564019 | 10/1993 | European Pat. Off. . |
| 60231764 | 11/1985 | Japan . |
| 63086775 | 4/1988 | Japan . |

OTHER PUBLICATIONS

Derwent Publications Ltd., London, GB, Abstract No. 86–004377. (1986).
Derwent Publications Ltd., London, GB, Abstract No. 86–109374. (1986).
Derwent Publications Ltd., London, GB, Abstract No. 88–144423. (1988).

*Primary Examiner*—Elizabeth Evans
*Attorney, Agent, or Firm*—Curtis, Morris & Safford, P.C.

[57] ABSTRACT

The invention relates to a material for producing electrically conducting connections in thermoplastic moldings, wherein the material contains a thermoplastic containing 0.5 to 30% by volume of conductive fibers having a length of 5 to 20 mm and a diameter of 5 to 100 μm and has a volume resistivity of less than 1 ohm.cm.

12 Claims, No Drawings

MATERIAL FOR PRODUCING ELECTRICALLY CONDUCTING CONNECTIONS IN THERMOPLASTIC MOLDINGS

The invention relates to a material for producing electrically conducting connections in thermoplastic moldings.

The demand for miniaturization and an increase in the production and efficiency of electrical appliances requires new circuit designs. A substantial improvement can be achieved if the housing wall is used as circuit carrier. This implies that the conductor tracks for the electrical connection of the circuit elements can be applied to the housing wall.

BACKGROUND OF THE INVENTION

It is known that copper conductors in the various designs can be injected into the housing plastics material as an insertion part (insert technique) or laid on it. This is, however, expensive since complex insertion parts have to be used in the shaping process. Similar to the conventional production of printed circuit boards are methods in which the inside of the housing is first electroplated completely. Coating is then carried out with a photoresist and the conductor pattern is structured by various exposure techniques (masks, laser), with subsequent development (etching). Two-component injection-molding methods (cf. European Patent Specifications 564 019-A2, 323 685-A, 256 428-A), in which the conductor pattern is first injection molded by means of a metallizable plastics material are advantageous. However, the plastics material must then be pretreated by various expensive methods (for example, Pd-nucleated). In the third step, the spaces between the conductor tracks are filled in. Copper or nickel is then deposited electrolessly on the surface of the pretreated material. Additional metal layers can be applied to these layers in further steps.

These methods require a very good adhesion of the metal to the plastics material. To increase the adhesion, a complicated, expensive and environmentally polluting pretreatment is required. In addition, the methods comprise a number of different individual steps which can be automated only with difficulty.

OBJECT OF THE INVENTION

The object of the invention is to use a material in the injection-molding process with which the conductor pattern can be injection molded together with the housing without aftertreatment.

SUMMARY OF THE INVENTION

According to the invention, the object is achieved by a material which contains a fiber-reinforced thermoplastic containing 0.5 to 30% by volume of conductive fibers in a length of 5 to 20 mm and a diameter of 5 to 100 $\mu$m and which has a volume resistivity of less than 1 ohm.cm. Expedient embodiments are specified in claims 2 to 6.

DETAILED DESCRIPTION OF THE INVENTION

Using the material according to the invention, it is possible for the conductor tracks either to be injection molded simultaneously with the housing (two-component injection molding) or injection molded separately and added as insertion part during the injection molding of the housing. The material enables a rapid "cabling" even during the production of the housing. To make contact between the electrical components of the device (for example, a motor) and the conductor tracks, contacts have to be molded into the conductor tracks as insertion part in the form of pins, eyelets, internal threads or solder tags or have to be subsequently screwed in using self-tapping threads or pressed in. It is also possible to bond the contacts of electrical components on using conductive adhesives. Additional steps are unnecessary. After the housing has been produced, it can be equipped with the electrical components.

The material has an adequate conductivity and high mechanical toughness (deformation of the housing without cracking the conductor tracks) and can be processed thermoplastically (for example, for injection molding). Thermoplastics in the broadest sense, i.e. substances which behave reversibly or intermediately in a thermoplastic manner, can be used. The thermoplastic matrix must have a lower softening point or melting point than the conductive fibers and any conductive or nonconductive fillers present. Metal powders, for example composed of iron, steel, copper, aluminum, nickel etc., and also conductive soots can be used as conductive fillers. The conductive fibers may be, inter alia, metal fibers composed of iron, steel, copper, aluminum, nickel and/or carbon fibers. Mixtures of various conductive fillers are also possible. Particularly preferred are very long and thin stainless-steel fibers. The use of metallized glass is also possible. Metal fibers can be used in combination with carbon fibers or conductive soots. Even at low proportions of fibers, the long and thin fibers used form a network which has a high conductivity in the flow direction. The conductivity is advantageously increased by using nonconducting fillers. If short or long glass fibers are used, the mechanical strength and rigidity are additionally increased. The fiber length of the short-glass-fiber reinforcement is less than 0.5 mm, whereas, in the case of long-glass-fiber reinforcement, fiber lengths of over 0.5 mm, preferably in the range from 5 to 20 mm, are reached. The content of nonconducting fillers is 0 to 50% by volume, preferably 0 to 10% by volume.

The use of the material according to the invention is particularly advantageous in cases where cabling has to be carried out in a large number of items, for example in the consumer-goods industry, or in a very confined space, such as, for example, in the field of telecommunications. The invention relates, in particular, to the use of the material for producing conductor tracks. In these conductor tracks, the length/width ratio of the tracks is at least 5 and preferably at least 10. Preferably, the components produced contain at least two conductor tracks.

The invention is explained in greater detail by reference to the following examples.

EXAMPLE 1

The geometry of conductor tracks was simulated by injection molding continuous spirals (cross section 5×2 mm$^2$, flow path length 50 to 100 cm).

Polyamide 66 to which approximately 11 mm long steel fibers having a diameter of 8 $\mu$m were added in various concentrations was used as thermoplastic. In individual experiments, conductive soot, carbon fibers or short-glass fibers were additionally added.

| | |
|---|---|
| A. PA 66-SF 10: | 10% by weight (1.4% by volume) stainless-steel fibers |
| B. PA 66-SF 20: | 20% by weight of stainless-steel fibers |
| C. PA 66-SF 10/conductive soot: | as A, with conductive soot (10% by weight) in addition |
| D. PA 66-SF 10/carbon fibers: | as A, with carbon fibers (10% by weight) in addition |
| E. PA 66-SF 10/SGF: | as A, with glass fibers (28% by weight) in addition |

The resistances in the extrusion direction were measured with a multimeter and the resistivities were calculated using the cross section of the continuous spiral and the spacing of the screws.

The continuous spirals were cut into pieces 10 cm long and the resistivity was calculated as a function of the flow path length and statistically evaluated. These values are cited in Table 1.

The fiber contents of the 10 cm pieces were determined by incineration. For this purpose, the polymer matrix was vaporized in a muffle furnace at approximately 500° C. The weight loss was determined by difference weighing and converted into the fiber content.

TABLE 1

Resistivities measured over continuous spirals

| | Products | Spiral length, cm | Hollow fiber content, % by wt. | Resistivity, ohm · cm |
|---|---|---|---|---|
| A. | PA 66-SF 10 | 75 | 13 +/− 3 | 0.06 +/− 0.04 |
| B. | PA 66-SF 20 | 55 | 20 +/− 4 | 0.02 +/− 0.01 |
| C. | PA 66-SF 10/ CF | 65 | 12 +/− 2 | 0.13 +/− 0.09 |
| D. | PA 66-SF 10/ conducting soot | 55 | 11 +/− 2 | 0.06 +/− 0.02 |
| E. | PA 66-SF 10/ SGF | 55 | 9 +/− 1 | 0.08 +/− 0.06 |

EXAMPLE 2

Continuous spirals from Example 1E (PA 66-SF 10/SGF) were contacted by means of self-tapping metal screws which were screwed into the core of the material to make contact, and operated as resistance heating spiral for several weeks.

| | |
|---|---|
| Spiral length (contact spacing): | 55 cm |
| Voltage drop: | 13 V |
| Current level: | 0.5 A |
| Temperature: | 60 to 100° C. |

What is claimed is:

1. A material for producing conductor tracks in thermoplastic moldings, wherein the material comprises a thermoplastic containing 0.5 to 30% by volume of conductive fibers and up to 50% by volume of nonconducting fillers, the fibers having a length of 5 to 20 mm and a diameter of 5 to 100 $\mu$m, and the material having a volume resistivity of less than 1 ohm.cm.

2. The material as claimed in claim 1, wherein the conductive fibers are selected from the group consisting of metal fibers, metallized glass fibers and carbon fibers.

3. The material as claimed in claim 1, further comprising a powdered conductive filler.

4. The material as claimed in claim 1, wherein the nonconducting fillers are composed of short glass fibers up to 0.5 mm long.

5. The material as claimed in claim 2, wherein the metal fiber is a stainless steel fiber.

6. The material as claimed in claim 3, wherein the conductive filler is conducting soot.

7. The material as claimed in claim 3, wherein the conductive filler is a metal powder selected from the group consisting of iron, steel, copper, aluminum and nickel.

8. The material as claimed in claim 2, wherein the metal fiber is selected from the group consisting of iron, steel, copper, aluminum and nickel.

9. The material as claimed in claim 1, further comprising up to 10% by volume of nonconducting fillers.

10. The material as claimed in claim 1, wherein the nonconducting fillers are composed of long glass fibers 5 to 20 mm long.

11. The material as claimed in claim 1 which contains 10 to 50% by volume of nonconducting fillers.

12. Conductor tracks in thermoplastic moldings, wherein the conductor tracks have a length/width ratio of at least five and are comprised of a material, said material comprising a thermoplastic containing 0.5 to 30% by volume of conductive fibers having a length of 5 to 20 mm and a diameter of 5 to 100 $\mu$m, said material having a volume resistivity of less than 1 ohm.cm.

* * * * *